United States Patent [19]

Guillot

[11] Patent Number: 4,882,711

[45] Date of Patent: Nov. 21, 1989

[54] NON-VOLATILE MEMORY SYSTEM

[75] Inventor: Pierre Guillot, Geneva, Switzerland

[73] Assignee: Motorola, Inc., Schaumburg, Ill.

[21] Appl. No.: 151,864

[22] Filed: Feb. 3, 1988

[30] Foreign Application Priority Data

Feb. 7, 1987 [GB] United Kingdom ............... 8702784

[51] Int. Cl.$^4$ .............................................. G11C 13/00
[52] U.S. Cl. ............................... 365/229; 365/189.04;
365/189.05
[58] Field of Search ........... 365/229, 227, 228, 189.04,
365/189.05

[56] References Cited

U.S. PATENT DOCUMENTS 4,712,195 12/1987 Finger ................................. 365/229

Primary Examiner—Terrell W. Fears
Attorney, Agent, or Firm—Michael D. Bingham

[57] ABSTRACT

A memory system comprising
a first, volatile memory (6) having a plurality of memory cells; at least one second, non-volatile memory ($E_1$-$E_n$) having a plurality of memory cells; power-down means (12) for sensing when power is withdrawn from the first memory and for transferring in response thereto contents of the cells of the first memory to the cells of the second memory; and power-up means (10) for sensing when power is applied to the first memory and for transferring in response thereto contents of the cells of the second memory to the cells of the first memory, is characterised by a plurality of said second, non-volatile memories and further comprising a register (8) for holding an indication of which of the second memories is to be used for transfer by at least the power-down means.

3 Claims, 1 Drawing Sheet

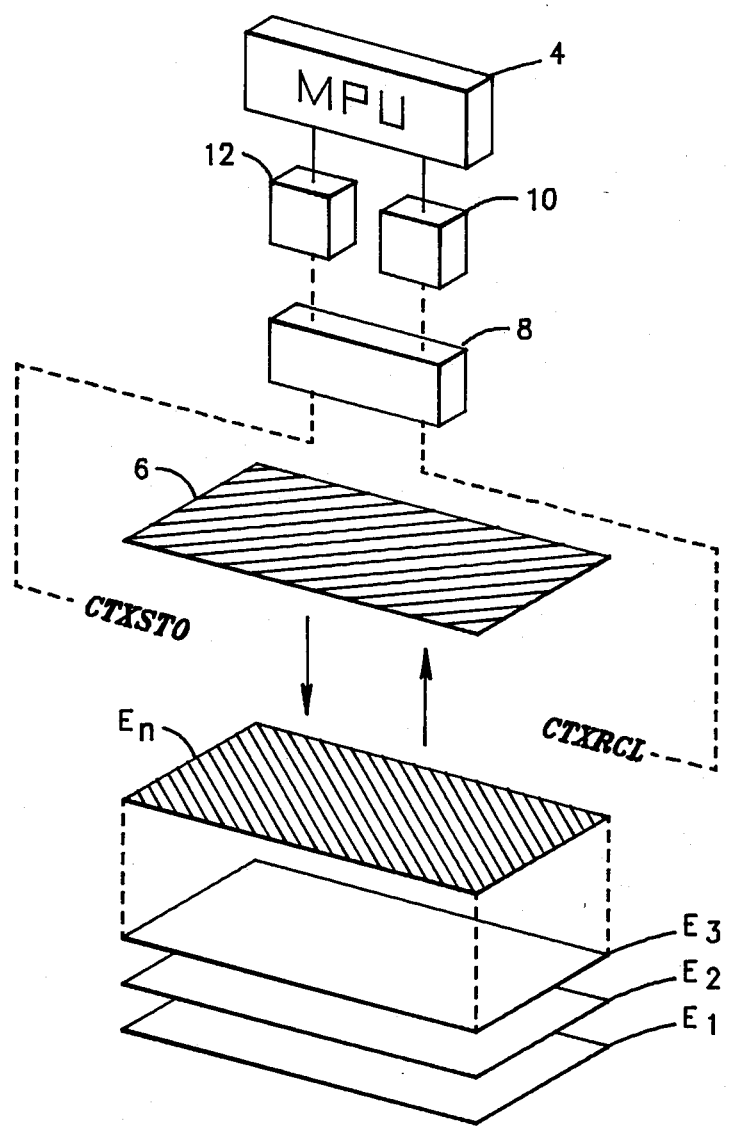

NON-VOLATILE MEMORY SYSTEM

This invention relates to non-volatile memory systems.

There is known a memory system comprising a first, volatile memory having a plurality of memory cells;

a second, non-volatile memory having a plurality of memory cells;

power-down means for sensing when power is withdrawn from the first memory and for transferring in response thereto contents of the cells of the first memory to the cells of the second memory; and power-up means for sensing when power is applied to the first memory and for transferring in response thereto contents of the cells of the second memory to the cells of the first memory.

Such non-volatile memory systems are available from a number of manufacturers.

However, in such memory systems the data to be transferred to the first, volatile memory is restricted only to that stored in the second, non-volatile memory. If it is desired to change the data and/or program used by the memory system it is necessary to power-up the system and over-write with a new program and/or data the original program and/or data in the first, dynamic memory, so destroying the original program and/or data.

It is an object of this invention to provide a memory system wherein this difficulty may be overcome.

In accordance with the present invention a memory system of the above known kind, wherein the improvement comprises a plurality of second, non-volatile memories and further comprises a register for holding an indication of which of the second memories is to be used for transfer by at least the power-down means.

Preferably the register is a non-volatile register and the power-up means is arranged to use the indication held by the register to determine which of the second memories is to be used for transfer by the power-up means.

Preferably the memory system is so arranged that the power-up and power-down means transfer the contents of all cells simultaneously.

One memory system in accordance with the present invention will now be described, by way of example only, with reference to the accompanying drawing, which shows a schematic, organisation diagram of the memory system.

Referring now to the accompanying drawing, a memory system 2 associated with a MPU (microprocessor unit) core 4 comprises a first portion of volatile short-address-time RAM (random access memory) 6 and a number n of second portions of non-volatile memory $E_l$-$E_n$. The portions of non-volatile memory $E_l$-$E_n$, which may be conveniently thought of as n different planes, are formed of EEPROM (electrically erasable programmable read only memory). The memory system 2 also includes a non-volatile register 8 which, like the non-volatile memory planes $E_l$-$E_n$, is formed of EEPROM. The memory system also includes power-up detection circuitry 10 and power-down detection 12 for detecting when operating power supply voltage is respectively applied to and withdrawn from the RAM 6.

A memory system operating in this manner is more fully described in the present applicant's copending UK patent application entitled "Memory System", having applicant's reference SC0034EG and filed on the same date as the present application; this copending application is hereby incorporated herein by reference.

In operation of the memory system 2 with MPU 4 each non-volatile memory plane $E_l$-$E_n$ typically holds a different program and/or data for the MPU 4, each allowing the system to be used in a different context, and the non-volatile register 8 holds a value indicative of one of the non-volatile memory planes $E_l$-$E_n$.

When power is applied to the system the power-up detection circuitry 10 senses this and causes a context recall instruction CTXRCL to be performed. The context recall instruction CTXRCL causes the contents of whichever non-volatile memory plane $E_l$-$E_n$ is indicated by the register 8 to be transferred to the RAM 6.

Conversely, when power is withdrawn from the system the power-down detection circuitry 12 senses this and causes a context store instruction CTXSTO instruction to be performed. The context store instruction CTXSTO causes the contents of the RAM 6 to be transferred to whichever non-volatile memory plane $E_l$-$E_n$ is indicated by the register 8. It will be appreciated that since the amount of electrical energy remaining in the system when power-down is detected is small, it is important that the transfer of cell contents from RAM to EEPROM plane is performed as quickly as possible, preferably with each bit being transferred simultaneously. Preferably also the transfer of cell contents from EEPROM plane to RAM is performed simultaneously for all bits.

After power-up the MPU 4 uses the program and/or data in RAM 6 (which may now be modified compared with when it was last recalled) stored in the appropriate context plane of non-volatile EEPROM memory $E_l$-$E_n$. If, after power-up of the system it is desired to change the context, i.e. change the program and/or data used in RAM 6 to that associated with a different EEPROM plane $E_l$-$E_n$, the MPU 4 firstly initiates a CTXSTO instruction to store the current RAM contents in the relevant context plane $E_l$-$E_n$, secondly changes the contents of the register 8 to indicate the new context plane $E_l$-$E_n$, and thirdly initiates a CTXRCL instruction to transfer the program and/or data of the desired new context to RAM. It will, of course, be appreciated that if it is not required to store the current state of the old context, the first step may be omitted.

It will also be appreciated that although the register 8 is described above as being formed of non-volatile EEPROM, the register may instead be of any other memory type such as RAM. In this case the ability to recall directly to RAM 6 the context in use at the last power-down is lost: the system instead transferring a default context to RAM at power-up.

It will, of course, be appreciated that the RAM 6 and the non-volatile EEPROM memory planes $E_l$-$E_n$ will normally be fabricated as a single integrated circuit including also the register 8 and the power-up and power-down detection circuitry 10, 12 and (if desired) the MPU 4.

I claim:

1. A memory system comprising:
a first volatile memory having a plurality of memory cells;
a plurality of second, non-volatile memories each having a plurality of memory cells;
a register for holding an indication of a predetermined one of the plurality of second memories;

power-down means for sensing when power is withdrawn from the first memory and for transferring in response thereto contents of the cells of the first memory to the cells of the predetermined one of the plurality of second memories whose indication is held in the register; and power-up means for sensing when power is applied to the first memory and for transferring in response thereto contents of the cells of a second memory to the cells of a first memory.

2. The memory system according to claim 1 wherein the register is a non-volatile register and the power-up means is arranged to transfer contents of the cells of the predetermined one of the plurality of second memories whose indication is held by the register.

3. A memory system according to claim 1 wherein the power-up and power-down means transfer the contents of all cells simultaneously.

* * * * *